(12) United States Patent
Gill

(10) Patent No.: US 6,519,117 B1
(45) Date of Patent: Feb. 11, 2003

(54) DUAL AP PINNED GMR HEAD WITH OFFSET LAYER

(75) Inventor: Hardayal Singh Gill, Portolla Valley, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/454,827

(22) Filed: Dec. 6, 1999

(51) Int. Cl.[7] .................................................. G11B 5/39
(52) U.S. Cl. .................................... 360/314; 360/324.12
(58) Field of Search ................................ 360/314, 315, 360/324.12

(56) References Cited

U.S. PATENT DOCUMENTS

| | | | |
|---|---|---|---|
| 5,287,238 A | | 2/1994 | Baumbert et al. |
| 5,422,571 A | | 6/1995 | Gurney et al. |
| 5,432,734 A | | 7/1995 | Kawano et al. |
| 5,442,508 A | | 8/1995 | Smith |
| 5,508,867 A | * | 4/1996 | Cain et al. .................. 360/113 |
| 5,627,703 A | * | 5/1997 | Smith ......................... 360/113 |
| 5,648,885 A | * | 7/1997 | Nishioka et al. ............ 360/113 |
| 5,701,223 A | | 12/1997 | Fontana, Jr. et al. |
| 5,705,973 A | * | 1/1998 | Yuan et al. ................ 338/32 R |
| 5,738,946 A | | 4/1998 | Iwaski et al. |
| 5,742,162 A | * | 4/1998 | Nepela et al. .............. 324/252 |
| 5,764,056 A | | 6/1998 | Mao et al. |
| 5,768,069 A | * | 6/1998 | Mauri ........................ 360/113 |
| 5,784,225 A | | 7/1998 | Saito et al. |
| 5,825,595 A | | 10/1998 | Gill |
| 5,828,529 A | | 10/1998 | Gill |
| 5,850,323 A | | 12/1998 | Kanai |
| 5,856,897 A | | 1/1999 | Mauri |
| 5,862,021 A | | 1/1999 | Deguchi et al. |
| 5,866,212 A | | 2/1999 | Kurosawa et al. |
| 5,869,963 A | | 2/1999 | Saito et al. |
| 5,872,502 A | | 2/1999 | Fujikata et al. |
| 6,061,210 A | * | 5/2000 | Gill ............................ 360/113 |
| 6,122,150 A | * | 9/2000 | Gill ........................ 360/324.11 |
| 6,175,475 B1 | * | 1/2001 | Lin et al. ............... 360/324.11 |

FOREIGN PATENT DOCUMENTS

| | | | |
|---|---|---|---|
| JP | 409083039 A | | 3/1997 |
| JP | 9-283816 | * | 10/1997 |
| JP | 410154618 A | | 6/1998 |
| JP | 410289421 A | | 10/1998 |
| JP | 11-103102 | * | 4/1999 |

OTHER PUBLICATIONS

By Tanaka, Shimizu, Kishi, Nagasaka & Oshiki; Dual Spin–Valve With Pd–Pt–Mn Anti–Ferromagnetic Layer; © Sep. 1997; IEEE Transactions on Magnetics, vol. 33, No. 5; Fujitsu Limited, Fujitsu Laboratories Ltd. 10–1 Morinosato–Wakamiya, Atsugi 243–01, Japan.

* cited by examiner

*Primary Examiner*—William Klimowicz
(74) *Attorney, Agent, or Firm*—Blakely, Sokoloff, Taylor & Zafman

(57) ABSTRACT

A dual spin valve magnetoresistive structure having a free layer and a spacer layer between the free layer and a pinned layer. The pinned layer is between the spacer layer and the antiferromagnetic layer. There is also an offset layer, where the antiferromagnetic layer is between the offset layer and the pinned layer. The offset layer is tailored to introduce a first magnetic field that reduces a net magnetic field within said free layer.

46 Claims, 4 Drawing Sheets

DUAL AP PINNED GMR HEAD WITH OFFSET LAYER

FIELD OF INVENTION

The field of invention relates to direct access data storage, generally. More specifically, the invention relates to the improved thermal stability of GMR based SV sensors for use within magnetic heads.

BACKGROUND OF THE INVENTION

Hardware systems often include memory storage devices having media on which data can be written to and read from. A direct access storage device (DASD or disk drive) incorporating rotating magnetic disks are commonly used for storing data in magnetic form. Magnetic heads, when writing data, record concentric, radially spaced information tracks on the rotating disks. Magnetic heads also typically include read sensors that read data from the tracks on the disk surfaces.

In high capacity disk drives, magnetoresistive (MR) read sensors, the defining structure of MR heads, can read stored data at higher linear densities than thin film heads. An MR head detects magnetic field(s) through the change in resistance of its MR sensor. The resistance of the MR sensor changes as a function of the direction of the magnetic flux that emanates from the rotating disk.

One type of MR sensor, referred to as a giant magnetoresistive (GMR) effect sensor, takes advantage of the GMR effect. In GMR sensors, the resistance of the MR sensor varies with direction of flux from the rotating disk and as a function of the spin dependent transmission of conducting electrons between magnetic layers separated by a non-magnetic layer (commonly referred to as a spacer) and the accompanying spin dependent scattering within the magnetic layers that takes place at the interface of the magnetic and non-magnetic layers.

GMR sensors using two layers of magnetic material separated by a layer of GMR promoting non-magnetic material are generally referred to as spin valve (SV) sensors. In an SV sensor, one of the magnetic layers, referred to as the pinned layer, has its magnetization "pinned" by exchange coupling with an antiferromagnetic layer. Due to the relatively high internal ferromagnetic coupling field associated with the pinning layer, the magnetization direction of the pinning layer typically does not rotate from the flux lines that emanate from the rotating disk. The magnetization direction of the other magnetic layer (commonly referred to as a free layer), however, is free to rotate with respect to the flux lines that emanate from the rotating disk.

FIG. 1 shows a type of spin valve sensor commonly referred to as a dual spin valve sensor 100, having end regions 104 and 106 separated by a central region 102. A free layer (Free MR layer) 110 (free) is separated from two outer pinned (pinned MR layer) layers 120 (PL1) and 130 (PL2) by two SV promoting spacer layers 140 (SP1) and 150 (SP2), respectively. Referring to FIG. 1B, the magnetization 121 within the first pinned layer 120 is fixed through exchange coupling with a first antiferromagnetic (AFM1) layer 125. The magnetization 131 within the second pinned layer 130 is fixed through exchange coupling with a second antiferromagnetic (AFM) layer 135 (AFM2).

Free layer 110, spacer layers 140 and 150, pinned layers 120 and 130 and the AFM layers 125 and 135 are all formed in the central region 102. Hard bias layers 160 and 170 formed in the end regions 104 and 106, respectively, longitudinally bias the MR free layer 110. Leads 180 and 190 formed over hard bias layers 160 and 170, respectively, provide electrical connections for the flow of the sensing current $I_s$ from a current source for the MR sensor 100.

A problem with structures such as or similar to that shown in FIG. 1 is the effect of the pinned layers 120,130 on the free layer 110. Specifically, as shown in FIG. 1, magnetic fields $Hd_{120, 130}$ (associated with magnetic poles at pinned layers 120, 130) as well as ferromagnetic coupling fields $Hfc_{120, 130}$ (associated with "orange peel" coupling between pinned layers 120, 130 and free layer 110) from the pinned layers 120, 130 provide a net bias on the free layer 110. Typically, the magnetic fields $Hd_{120, 130}$ have more strength than the ferromagnetic coupling fields $Hfc_{120, 130}$ resulting in an undesirable net field $H_{110}$ at free layer 110. Net field $H_{110}$ affects the orientation of magnetic moment within the free layer 110 which adversely affects the MR sensing capability of structure 100.

SUMMARY OF THE INVENTION

An apparatus, comprising a dual spin valve magnetoresistive structure having a free layer and a spacer layer between the free layer and a pinned layer. The pinned layer is between the spacer layer and the antiferromagnetic layer. There is also an offset layer, where the antiferromagnetic layer is between the offset layer and the pinned layer. The offset layer is tailored to introduce a first magnetic field that reduces a net magnetic field within said free layer.

BRIEF DESCRIPTION OF THE DRAWINGS

The present invention is illustrated by way of example and not limitation in the figures of the accompanying drawings, in which like references indicate similar elements, and in which:

FIG. 1a shows a dual spin valve MR sensor structure.

FIG. 1b shows fields associated with the dual spin valve MR sensor structure of FIG. 1a.

DETAILED DESCRIPTION

A dual spin valve magnetoresistive structure having a free layer and a spacer layer between the free layer and a pinned layer. The pinned layer is between the spacer layer and the antiferromagnetic layer. There is also an offset layer, where the antiferromagnetic layer is between the offset layer and the pinned layer. The offset layer is tailored to introduce a first magnetic field that reduces a net magnetic field within said free layer.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Figure 2:
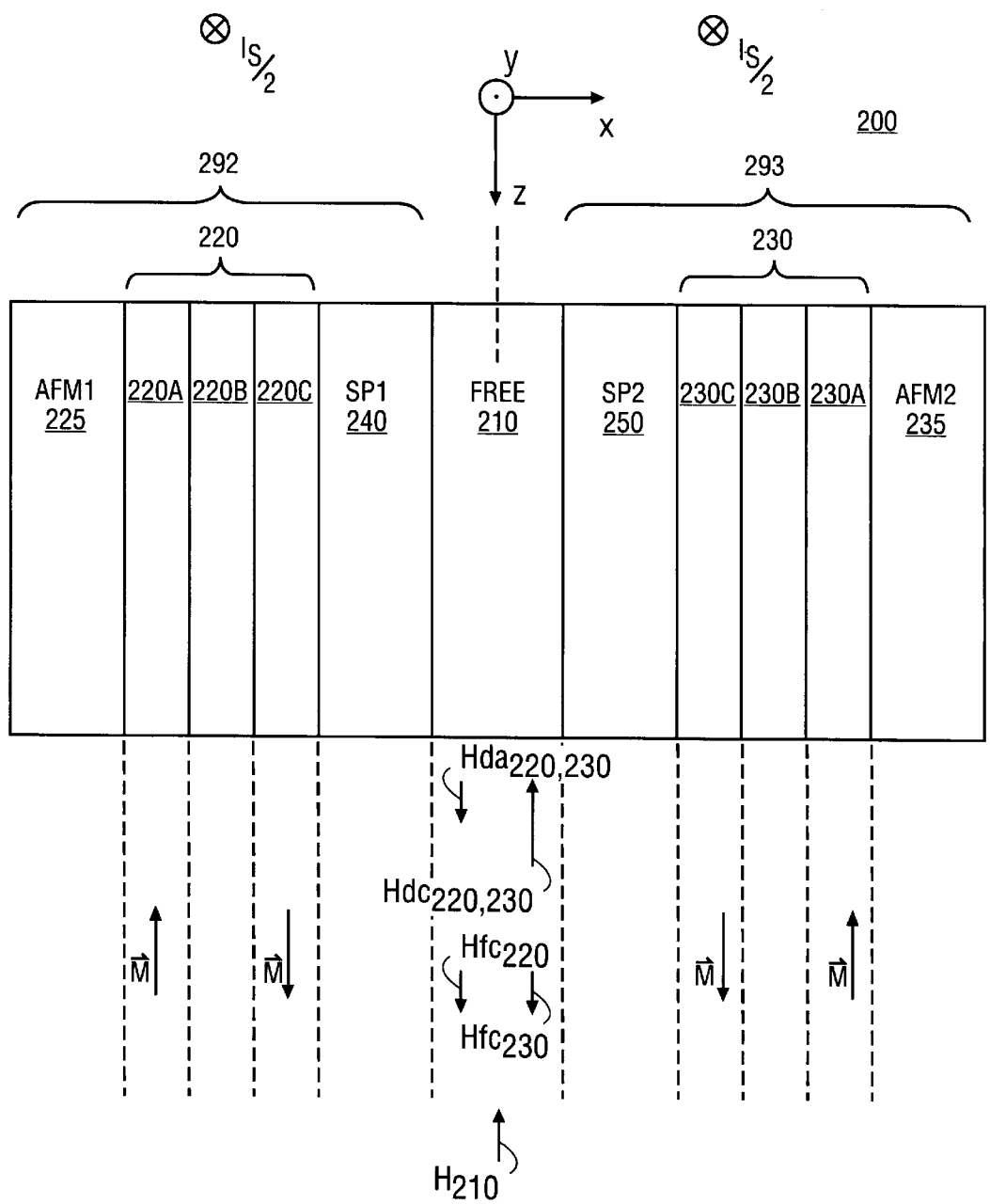
FIG. 2 shows an AP pinned dual spin valve MR sensor structure.

FIG. 2 shows a dual spin valve structure 200 with a reduced net field $H_{210}$ in the free layer 210. Note the structure 200 of FIG. 2 employs two AP pinned layers 220, 230. As is known in the art, AP pinned layers are typically formed with three layers: a first magnetic layer 220a, 230a; a non-magnetic metallic layer 220b, 230b and a second magnetic layer 220c, 230c.

Figures 1A, 1B:
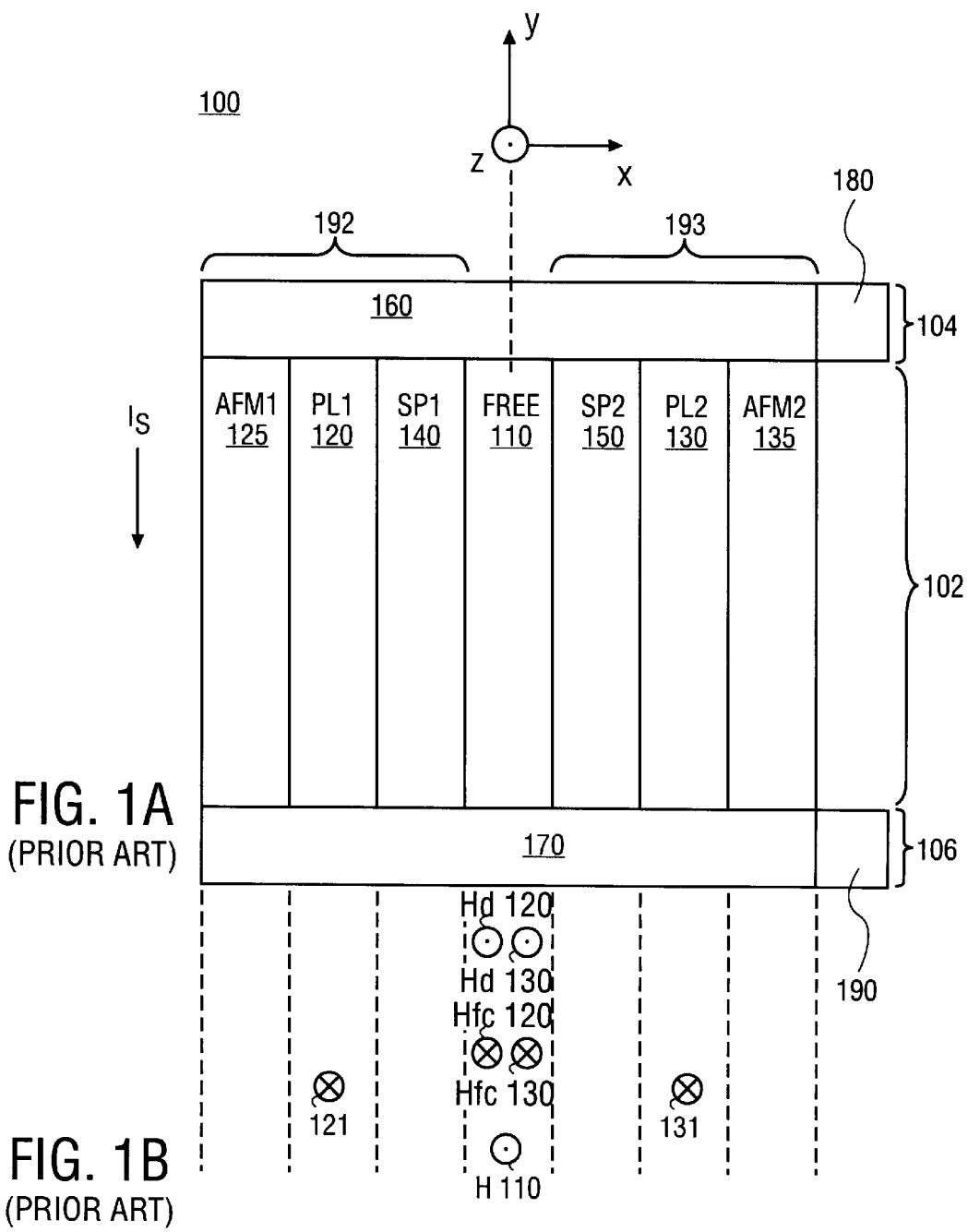

The AP pinned layers 220, 230 are used to reduce the field strength associated with $Hd_{120, 230}$ of FIG. 1. Since the magnetic moment of the first magnetic layers 220a, 230a and second magnetic layers 220c, 230c are anti-parallel, as shown in FIG. 2, their associated magnetic fields within free layer 210 $Hda_{220, 230}$ and $Hdc_{220, 230}$ subtract from one another. The overall effect is reduced magnetic field strength at free layer 210.

Even though the magnetic field strength is reduced, it is still not effectively canceled out by the AP pinned structure 220, 230 (as shown in FIG. 2 by the differences between the vector magnitudes $Hda_{220, 230}$ and $Hdc_{220, 230}$) or the ferromagnetic coupling fields $Hfc_{220, 230}$ from the AP pinned layers 220, 230. The result is, again, an undesirable net field $H_{210}$ at free layer 210. In order to continue the traditional increase in the achievable linear densities of magnetic disk drives technology, net field $H_{210}$ should be further reduced to acceptable levels.

Note the traditional designs of FIGS. 1 and 2 form a symmetric structure. That is, the left side 192, 292 of the structure 100, 200 is a mirror image of the right side 193, 293 of the structure 200. With symmetrical structures 100, 200 the contribution to the strength of the magnetic Hd and ferromagnetic coupling fields Hfc formed at free layer 110, 210 are approximately 50% from the left side 192, 292 and 50% from the right side 193, 293. Another way of stating this, referring to FIG. 2, is that at any point along the z axis in FIG. 2:

$$|Hfc_{220}| \approx |Hfc_{230}| \quad \text{Eqn. 1}$$

$$|Hda_{220} - Hdc_{220}| \approx |Hda_{230} - Hdc_{230}|. \quad \text{Eqn. 2}$$

where $Hda_{220}$ is the component of $Hda_{220, 230}$ produced by layer 220a and $Hda_{230}$ is the component of $Hda_{220, 230}$ produced by layer 230a. Similarly, $Hdc_{220}$ is the component of $Hdc_{220, 230}$ produced by layer 220c and $Hdc_{230}$ is the component of $Hdc_{220, 230}$ produced by layer 230c.

Also note that the sensing current $I_s$ flows evenly (i.e., $_s/2$) on each side 292, 293. The resulting magnetic field from the sensing current within free layer 210, according to Ampere's law, cancels out as a result of this even current flow.

Recall that a problem with the symmetrical structures of FIGS. 1 and 2 is that the magnetic field Hd is noticeably stronger than the ferromagnetic coupling field Hfc. That is, at any point along the z axis of FIG. 2:

$$|Hfc_{220}| + |Hfc_{230}| \neq |Hda_{220} - Hdc_{220}| + |Hda_{230} - Hdc_{230}| \quad \text{Eqn. 3}$$

$$|H_{210}| = \text{field within free layer } 210 \neq 0 \quad \text{Eqn. 4}$$

Figure 3:
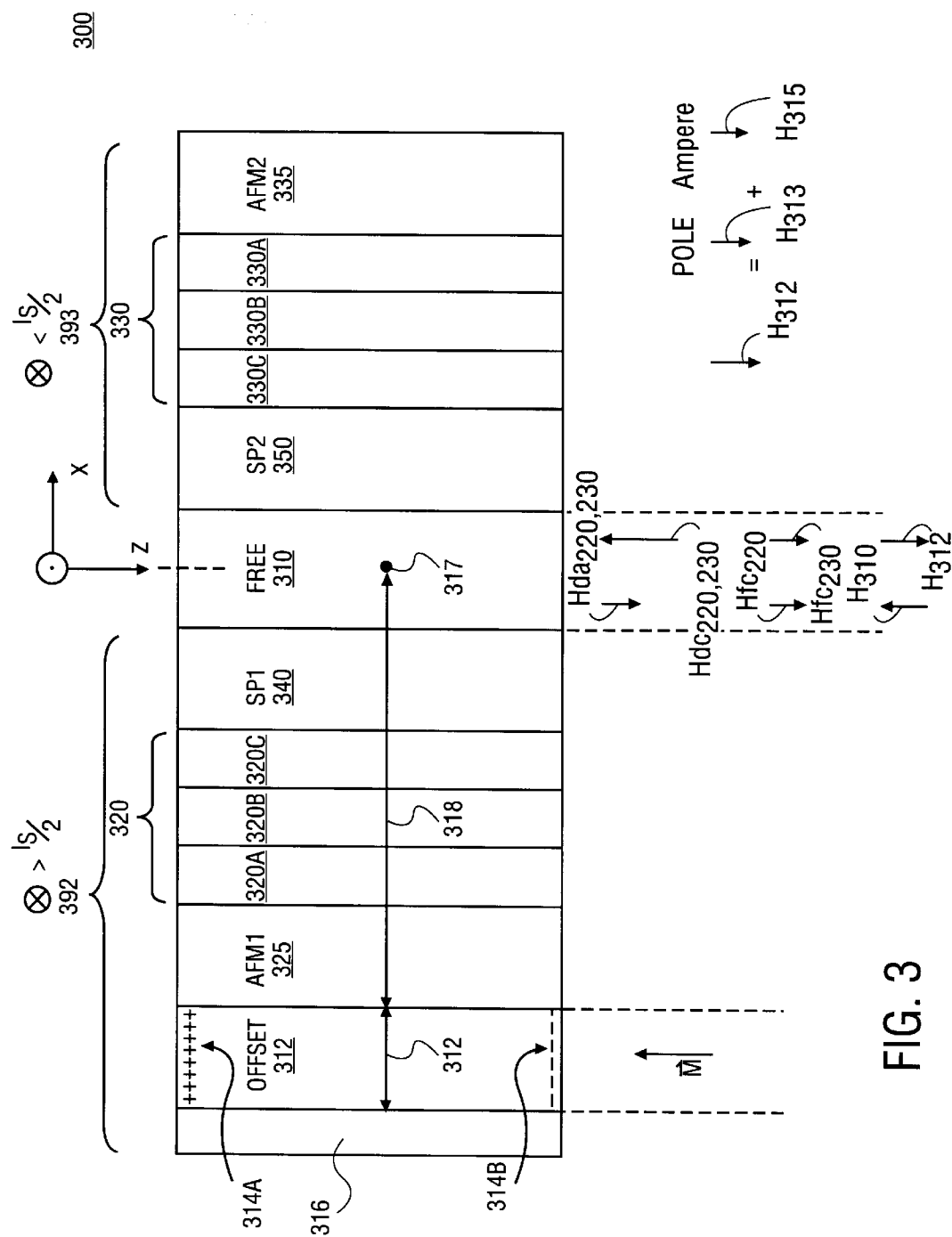
FIG. 3 shows an embodiment of an AP pinned dual spin valve MR sensor structure having an offset layer.

FIG. 3 shows an AP pinned structure 300 having a net field $H_{312}$ reduced to an acceptable level. The structure 300 is capable of forming a net field $H_{312}$ of less than a few Oersteads. Comparing structures 100, 200 of FIGS. 1, 2 with the structure 300 of FIG. 3, note the presence of an offset layer 312. An offset layer 312 is a material that introduces one or more additional fields within the free layer 310 in order to offset any difference between the ferromagnetic coupling and magnetic fields within the free layer 310 created by the antiferromagnetic 325,335 or pinned layers 320, 330.

For example, offset layer 312 introduces an offset magnetic field $H_{312}$ anti-parallel (i.e., directed 180° apart) to the net field $H_{210}$ of FIGS. 2. Note that net field $H_{310}$ of FIG. 3 in this description is equivalent to the net field $H_{210}$ of FIG. 2 without the offset layer. That is, net field $H_{310}$ is the field resulting from the layers other than offset later 312. The following relationships are therefore substantially implemented in the structure 300 of FIG. 3 at any point along the z axis:

$$|Hfc_{220}| + |Hfc_{230}| + |H_{312}| = |Hda_{220} - Hdc_{220}| + |Hda_{230} - Hdc_{230}| \quad \text{Eqn. 5}$$

$$|H_{310}| - |H_{312}| = \text{field within free layer } 310 = 0 \quad \text{Eqn. 6}$$

Offset layer 312 is designed to produce an offset magnetic field $H_{312}$ of approximately the same magnitude as net field $H_{310}$ resulting in the effective cancellation of net field $H_{310}$. This results in a more properly biased free layer 310 (as compared to the free layer 210 of FIG. 2) resulting in a structure 300 having improved MR characteristics over the structure 100, 200 of FIGS. 1 and 2.

Note that two magnetic field components contribute to the magnitude of field $H_{312}$ introduced by the offset layer 312. The first magnetic field component results from the pole density 314a,b of offset layer 312. The offset layer 312 associated with the embodiment shown in FIG. 3, as discussed in more detail ahead, is a magnetic material (and in the particular case of FIG. 3, a ferromagnetic material) having a fixed magnetic moment. Thus, a first magnetic field associated with this moment, referred to as a pole field $H_{313}$, is formed.

The second magnetic field component that contributes to the magnetic field introduced by the offset layer 312 is associated with Ampere's law. Recall that in structure 200 of FIG. 2, the sensing current $I_s$ flows evenly (i.e., $I_s/2$) on each side 292, 293. The resulting magnetic field from the sensing current within free layer 210, according to Ampere's law, cancels out as a result of this even current flow.

Since the offset layer 312 is also conductive in the embodiment of FIG. 3, the current flow within structure 300 is imbalanced rather than even. That is, offset layer 312 conducts a portion of sensing current $I_s$ and, as a result, more current flows through the left side 392 of structure 300 than the right side 393. The imbalanced current flow through structure 300 introduces an Ampere magnetic field $H_{315}$ in the free layer 310 as shown in FIG. 3. Thus, according to the embodiment of FIG. 3, the offset magnetic field $H_{312}$ may be expressed as:

$$|H_{312}| = |H_{313}| + |H_{315}| \quad \text{Eqn. 7}$$

In an embodiment of the structure 300 of FIG. 3, offset layer 312 is a 10 Å layer of $Co_{90}Fe_{10}$. The offset layer 312 is formed upon a 30 Å seed layer 316 of $Ni_xMn_{50-x}O_{50}$. The AFM layers 325, 335 are 60 Å layers of IrMn. The AP Pinned layers 320, 330 are both formed with 20 Å first magnetic layers 320a, 330a of $Co_{90}Fe_{10}$ and 26 Å third magnetic layers 320c, 330c of $Co_{90}Fe_{10}$ separated by an 8 Å layer 320b, 330b of Ru. The spacers 340, 350 are 21 Å layers of Cu. The free layer 310 is a multilayer structure having 10 Å of $Ni_{80}Fe_{20}$ sandwiched between a 10 Å layer of $Co_{90}Fe_{10}$ and another 10 Å layer of $Co_{90}Fe_{10}$. Other materials and thicknesses may be used where appropriate as determined by those of skill in the art.

Also, as can be determined by those of skill in the art, the various thicknesses and materials of structure 300 may be tailored (as an example) to correspond to a field magnitude $H_{310}$ (from layers other than offset layer 312) of 10.0 Oe at the free layer origin 317. Note that much of the intensity of field magnitude $H_{310}$ arises out of the thickness differences between third magnetic layers 320c, 330c (26 Å) and first magnetic layers 320a, 330a (20 Å).

The distance 318 of the offset layer 312 from the free layer origin 317, as well as the offset layer 312 thickness and magnetic moment may be tailored to correspond to a pole field $H_{313}$ component intensity of 5.0 Oe at the free layer origin 317. Furthermore, a current flowing through offset layer 312 that corresponds to an Ampere magnetic field $H_{315}$ component intensity, at the free layer origin 317, of 5.0 Oe may also be applied. Note that the current through offset layer 312 is a function of sensing current $I_s$ and the resistance of offset layer 312 in light of the total resistance of structure 300). Thus, as an example and consistent with Equation 7, 10.0 Oe=5.0 Oe+5.0 Oe. Offset layer 312 may be viewed then as a compensating layer for the above mentioned thickness differences within layer 320,330.

It is important to note that embodiments other than the embodiment of FIG. 3 may be implemented. For example, different materials, material compositions and/or thicknesses may be used. As these differences should result in different field $H_{310}$, $H_{313}$, $H_{315}$ magnitudes than those listed above, one of skill in the art is capable or tailoring the offset layer to effectively nullify the field strength within the free layer. Furthermore, an offset layer may be used in non AP pinned structures such as structure 200 of FIG. 2.

The AFM layers 325,335 may be PtMn or NMn. PtMn or NMn AFM layers may be thicker, such as 200–300 Å. However, thicker layers may reduce the linear density of the data storage device. Cu may be used instead of Ru within the second layer 320b, 330b of the AP Pinned layers 320, 330.

Also, in various embodiments, the offset layer may be entirely conductive or entirely magnetic. That is, unlike an offset layer having two components as described above (one from the offset layer pole density and another from the current passing through the offset layer), some embodiments may choose to implement a non-conductive magnetic material (e.g., $Fe_2O_3$) or a non-magnetic conducting material (e.g., Cu). The offset layer may also be multilayer structure. For example, a thin layer of Cu and thin layer of $Fe_2O_3$.

Note that in the embodiment of FIG. 3, the seed layer 316 is substantially in the FCC phase. That is, most of the grains that form seed layer 316 are in the FCC phase. Forming an FCC phase seed layer 316 helps determine the crystal orientation of the subsequent layers in structure 300. For example, an FCC seed layer 316 can be used promote a <111> free layer 310. A <111> oriented free layer has been observed to exhibit good MR characteristics. Note that the <111> direction is parallel to the x axis in FIG. 3.

The process used to form structure 300 may be performed on standard equipment known in the art for producing magnetic multilayer structures such as structure 300 of FIG. 3. The parameters used to form such structures vary from equipment type to equipment type and may be readily determined by those of ordinary skill in the art.

Figure 4:
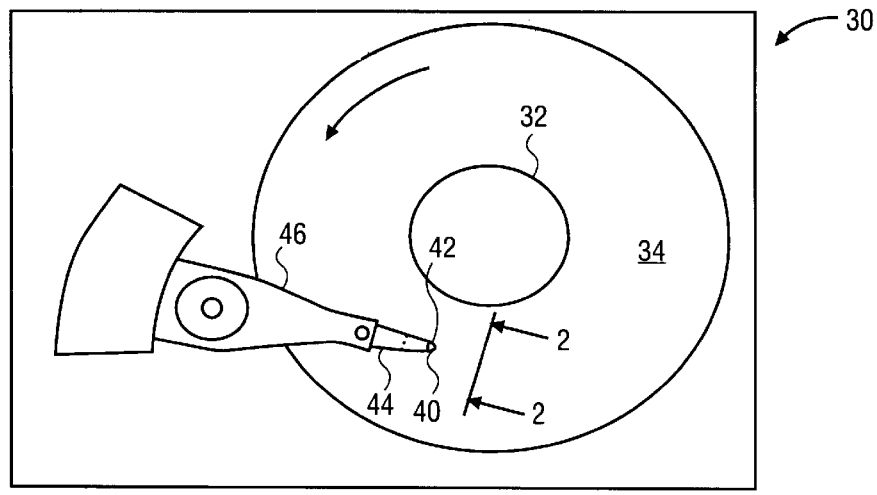
FIG. 4 shows a magnetic disk and activator.
Figure 5:
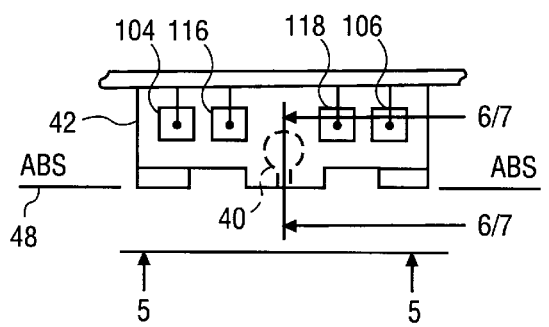
FIG. 5 shows an air bearing surface.
Figure 6:
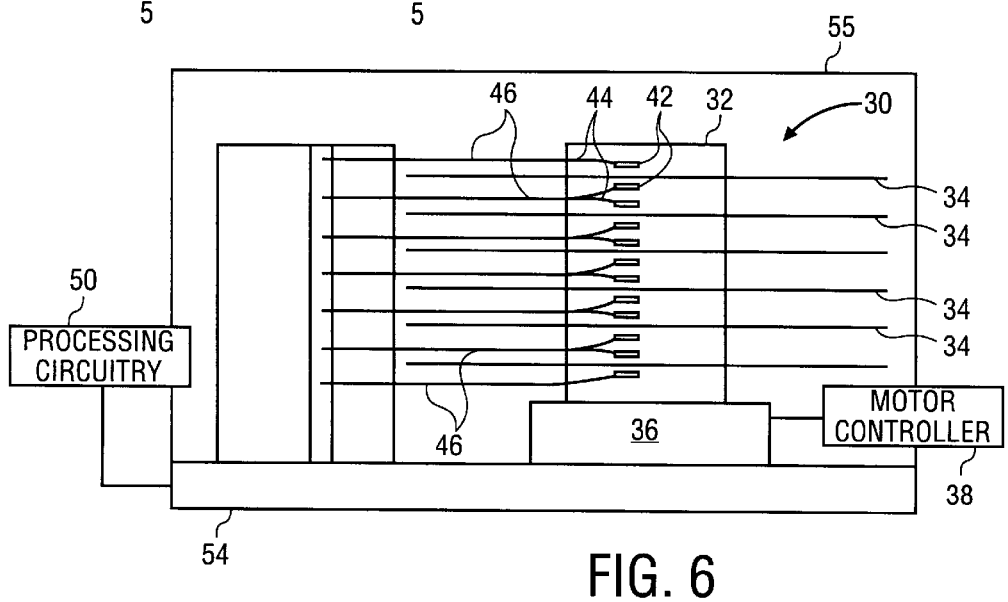
FIG. 6 shows a direct access storage device.

Referring now to the drawings wherein like reference numerals designate like or similar parts throughout the several views, FIGS. 4–6 illustrate a magnetic disk drive 30. The drive 30 includes a spindle 32 that supports and rotates a magnetic disk 34. The spindle 32 is rotated by a motor 36 that is controlled by a motor controller 38. A slider 42 with a combined read and write magnetic head 40 is supported by a suspension 44 and actuator arm 46. A plurality of disks, sliders and suspensions may be employed in a large capacity direct access storage device (DASD) as shown in FIG. 6. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 μm) cushion of air (air bearing) between the surface of the disk 34 and the air bearing surface (ABS) 48. The magnetic head 40 may then be employed for writing information to multiple to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks.

What is claimed is:

1. An apparatus, comprising:
   a dual spin valve magnetoresistive structure having a free layer, a spacer layer between said free layer and a pinned layer, said pinned layer between said spacer layer and an antiferromagnetic layer, said dual spin valve magnetoresistive structure also having an offset layer, said antiferromagnetic layer between said offset layer and said pinned layer, said offset layer tailored to introduce a first magnetic field that reduces a net magnetic field within said free layer, wherein said offset layer further comprises a multilayer structure.

2. The apparatus of claim 1 wherein said pinned layer is an anti-parallel (AP) pinned layer.

3. The apparatus of claim 2 wherein said anti-parallel pinned layer further comprises CoFe.

4. The apparatus of claim 2 wherein said anti-parallel pinned layer comprises Ru.

5. The apparatus of claim 1 wherein said antiferromagnetic layer further comprises IrMn.

6. The apparatus of claim 1 wherein said offset layer further comprises CoFe.

7. The apparatus of claim 1 wherein said offset layer further comprises Cu.

8. The apparatus of claim 1 further comprising a seed layer, said offset layer between said seed layer and said antiferromagnetic layer.

9. The apparatus of claim 8 wherein said seed layer further comprises NiMnO.

10. The apparatus of claim 8 wherein said seed layer further comprises copper.

11. The apparatus of claim 8 wherein said seed layer further comprises an FCC lattice structure.

12. The apparatus of claim 11 wherein said free layer has a <111> crystalline orientation.

13. An apparatus, comprising:
    a dual spin valve magnetoresistive structure having a free layer, a spacer layer between said free layer and a pinned layer, said pinned layer between said spacer layer and an antiferromagnetic layer, said dual spin valve magnetoresistive structure also having an offset layer, said antiferromagnetic layer between said offset layer and said pinned layer, said offset layer tailored to introduce a first magnetic field that reduces a net magnetic field within said free layer, said dual spin layer valve magnetoresistive structure also having a seed layer, said offset layer between said seed layer and said antiferromagnetic layer.

14. The apparatus of claim 13 wherein said pinned layer is an anti-parallel (AP) pinned layer.

15. The apparatus of claim 14 wherein said anti-parallel pinned layer further comprises CoFe.

16. The apparatus of claim 14 wherein said anti-parallel pinned layer further comprises Ru.

17. The apparatus of claim 13 wherein said antiferromagnetic layer further comprises IrMn.

18. The apparatus of claim 13 wherein said offset layer further comprises CoFe.

19. The apparatus of claim 13 wherein said offset layer further comprises Cu.

20. The apparatus of claim 13 wherein said seed layer further comprises NiMnO.

21. The apparatus of claim 13 wherein said seed layer further comprises copper.

22. The apparatus of claim 13 wherein said seed layer further comprises an FCC lattice structure.

23. The apparatus of claim 22 wherein said free layer has a <111> crystalline orientation.

24. An apparatus, comprising:
   a) a direct access storage file having a disk for storing data, said disk located proximate to a head used for reading said data from said disk; and
   b) a dual spin valve magnetoresistive structure within said head, said magentoresistive structure having a free layer, a spacer layer between said free layer and a pinned layer, said pinned layer between said spacer layer and an antiferromagnetic layer, said dual spin valve magnetoresistive structure also having an offset layer, said antiferromagnetic layer between said offset layer and said pinned layer, said offset layer tailored to introduce a first magnetic field that reduces a net magnetic field within said free layer, said dual spin valve magnetoresistive structure also having a seed layer, said offset layer between said seed layer and said antiferromagnetic layer.

25. The apparatus of claim 24 wherein said pinned layer is an anti-parallel (AP) pinned layer.

26. The apparatus of claim 25 wherein said anti-parallel layer further comprises CoFe.

27. The apparatus of claim 25 wherein said anti-parallel layer further comprises Ru.

28. The apparatus of claim 24 wherein said antiferromagnetic layer further comprises IrMn.

29. The apparatus of claim 24 wherein said offset layer further comprises CoFe.

30. The apparatus of claim 24 wherein said offset layer further comprises copper.

31. The apparatus of claim 24 wherein said seed layer further comprises NiMnO.

32. The apparatus of claim 24 wherein said seed layer further comprises copper.

33. The apparatus of claim 24 wherein said seed layer further comprises an FCC lattice structure.

34. The apparatus of claim 33 wherein said free layer has a <111> crystalline orientation.

35. An apparatus, comprising:
   a) a direct access storage file having a disk for storing data, said disk located proximate to a head used for reading said data from said disk; and
   b) a dual spin valve magnetoresistive structure within said head, said dual valve magnetoresistive structure having a free layer, a spacer layer between said free layer and a pinned layer, said pinned layer between said spacer layer and an antiferromagnetic layer, said dual spin valve magnetoresistive structure also having an offset layer, said antiferromagnetic layer between said offset layer and said pinned layer, said offset layer tailored to introduce a first magnetic field that reduces a net magnetic field within said free layer, wherein said offset layer further comprises a multilayer structure.

36. The apparatus of claim 35 wherein said pinned layer is an anti-parallel (AP) pinned layer.

37. The apparatus of claim 36 wherein said anti-parallel layer further comprises CoFe.

38. The apparatus of claim 36 wherein said anti-parallel layer further comprises Ru.

39. The apparatus of claim 35 wherein said antiferromagnetic layer further comprises IrMn.

40. The apparatus of claim 35 wherein said offset layer further comprises CoFe.

41. The apparatus of claim 35 wherein said offset layer further comprises copper.

42. The apparatus of claim 35 further comprising a seed layer, said offset layer between said seed layer and said antiferromagnetic layer.

43. The apparatus of claim 42 wherein said seed layer further comprises NiMnO.

44. The apparatus of claim 42 wherein said seed layer further comprises copper.

45. The apparatus of claim 42 wherein said seed layer further comprises an FCC lattice structure.

46. The apparatus of claim 45 wherein said free layer has a <111> crystalline orientation.

* * * * *